(12) United States Patent
Coon

(10) Patent No.: US 6,348,661 B1
(45) Date of Patent: Feb. 19, 2002

(54) CORROSION PROTECTION FOR WIRELESS FLEXURE

(75) Inventor: Warren Coon, Temecula, CA (US)

(73) Assignee: Magnecomp Corp., Temecula, CA (US)

( * ) Notice: Subject to any disclaimer, the term of this patent is extended or adjusted under 35 U.S.C. 154(b) by 0 days.

(21) Appl. No.: 09/655,513

(22) Filed: Sep. 1, 2000

Related U.S. Application Data

(60) Provisional application No. 60/224,681, filed on Aug. 11, 2000.

(51) Int. Cl.[7] .................................................. H05K 1/00
(52) U.S. Cl. ............................. 174/254; 439/67; 439/77
(58) Field of Search ........................... 174/729, 254, 174/259; 361/750, 751, 749, 777, 760, 748, 783, 782, 792, 754, 765; 439/67, 77

(56) References Cited

U.S. PATENT DOCUMENTS

| | | | | |
|---|---|---|---|---|
| 4,065,199 A | * | 12/1977 | Andre et al. ................... 339/17 |
| 4,265,549 A | * | 5/1981 | Cote ........................... 400/124 |
| 4,488,016 A | * | 12/1984 | Fukukura ........................ 200/5 |
| 4,906,803 A | * | 3/1990 | Albrechta et al. ........... 174/254 |
| 5,250,758 A | * | 10/1993 | Fjelstad et al. .............. 174/254 |
| 5,499,161 A | * | 3/1996 | Hosseinzadeh et al. ...... 361/749 |
| 5,610,642 A | * | 3/1997 | Nobel et al. ................... 347/50 |
| 6,150,614 A | * | 11/2000 | Miller et al. ................. 174/254 |

* cited by examiner

Primary Examiner—Jeffrey Gaffin
Assistant Examiner—José H. Alcala
(74) Attorney, Agent, or Firm—Louis J. Bachand

(57) ABSTRACT

In the manufacture of disk drive suspension flexures, an absence of exposed unplated conductive trace ends at the locus of severing individual flexures from a panel of flexures is achieved by reducing the cross section a portion of the conductive traces at the locus of severing so that the portion preferentially melts upon passage of a current through the conductive traces, severing the portion and encasing the severed ends in melted plastic from the flexure plastic film layer.

12 Claims, 5 Drawing Sheets

CORROSION PROTECTION FOR WIRELESS FLEXURE

CROSS-REFERENCE TO RELATED APPLICATIONS

This application claims the benefit of U.S. Provisional Patent Application Ser. No. 60/224,681 filed Aug. 11, 2000.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

This invention relates to disk drive suspensions, and more particularly to wireless suspensions in which the flexure is wireless and comprises a laminate of plastic film, trace conductors, and a metal layer. In a specific aspect, the invention relates to the manufacture of suspension flexures and, particularly, to the continuous protection of the trace conductors from environmental corrosion, to avoid maleffects including introduction of aerosol particulate contaminants into the assembly process and eventual inadvertent shunting or shorting out of the assembled parts.

2. Description of the Related Art

Environmental exposure of portions of copper conductors has been a problem for many years. Various approaches have been tried. For example, so-called conformal coatings, generally a varnish-like covering material, have been used on suspension arm assemblies such as the IBM 3350/70/80 arm assemblies from the 1970's and 1980's. This material resisted solvents and the different atmospheres encountered in the manufacturing and the user environment. Applied by hand, use of the material required a heat cure cycle.

It has been proposed to use a non reactive or non corrodible material for the traces, such as gold. At present, however, the precursor three-layer laminate material used for flexible circuitry and the invention flexures is not available with a gold layer that would enable production of circuitry comprising a gold/polyimide/stainless steel laminate; presently only a copper/polyimide/stainless steel laminate is available.

Better control of the manufacturing environment has been attempted to minimize the noted corrosion problems, e.g., by improving storage and handling procedures to reduce the time the part is exposed to the worst environment. The parts are stored in nitrogen gas-backfilled or vacuum containers pending processing. This approach, however, does not address contamination and corrosion impacts on reliability at the user level where the environment is not so well controlled.

BRIEF SUMMARY OF THE INVENTION

It is an object of the invention, therefore, to provide a better solution to the problem of environmental corrosion of exposed copper conductive traces in wireless flexures and to thereby lessen or eliminate results of such corrosion including contaminating aerosols and shunting of conductors. It is a further object to provide an improved wireless flexure manufacturing process in which the copper pigtails (continued extents of the trace conductors that are not operating parts of the assembly) at the locus of severing are reliably severed to free each flexure from the panel of flexures and, in a preferred embodiment, at the same time encased in insulating plastic film. It is a further object to provide in the course of a laminate flexure manufacturing operation a part that has its copper continually encased with plastic film, and in a preferred embodiment, totally free of exposed copper. It is thus an object to thereby prevent any particles or conductive paste associated with the copper conductors isolated from the environment and blocked from creating harm.

It is a highly specific object to provide a manufacturing process for a wireless flexure and a flexure product in which the conductive traces are modified at their pigtails to be of lesser cross-section, such that a current passing through the traces will preferentially melt the reduced cross-section and sever the trace pigtail there. Heat conducted to the surrounding plastic film at the locus of severing also serves to melt the plastic film layer at the locus and the melted plastic will reduce or eliminate copper exposure and block loss of contaminants from the copper into the surrounding environment.

These and other objects of the invention to become apparent hereinafter, are realized in the invention manufacturing process for flexures for disk drive suspensions that comprise a laminate of a plastic film and conductive traces, which includes defining a plurality of flexures in the laminate each having a predetermined perimeter that is spaced from the predetermined perimeters of adjacent flexures, maintaining a continued extent of the conductive traces across their respective flexure predetermined perimeters to electrically connect the conductive traces to a common conductor, and separating the conductive traces of individual flexures from the laminate by selectively melting the trace continued extents to sever the individual flexure conductive traces from the remainder of the flexures defined in the laminate and melt adjacent plastic film thereonto in exposed conductive trace-free relation.

In particular embodiments, the invention process further includes employing as the laminate a laminate of the plastic film, the conductive traces and a third layer comprising steel, defining a reduced cross section portion in the trace continued extent, and applying a current across the portion to selectively melt the portion while leaving the balance of the trace conductors intact, providing a contact pad on the flexure electrically connected to the trace continued extents, connecting the trace continued extents to a ground, and passing a sufficient current from the pads to ground through the continued extent portions to differentially melt the portions selectively from the remainder of the trace conductors.

In its product aspects, the invention provides a flexure for a disk drive suspension comprising a laminate of plastic film and trace conductors, the flexure having a predetermined perimeter, the trace conductors being generally of a first cross-section, the trace conductors having continued extents extending to and beyond the perimeter of the flexure, the continued extents defining a locus of severing for detaching the flexure from surrounding laminate adjacent the flexure predetermined perimeter, the continued extents having a portion with a reduced cross-section from the first cross-section at the locus for melting preferentially in response to a current passed through the trace conductors and the reduced cross-section portion.

In this and like embodiments, typically, the plastic film comprises polyimide resin, the conductive traces are formed of copper deposited onto the plastic film, the cross-section of the conductive traces is generally about 0.002 by 0.0007 inch, the cross-section of the reduced cross section portion being about 0.0004 by 0.0007 inch, the reduced cross section portion is melt-severed in trace conductor interrupting relation at the locus, the portion within the predetermined perimeter of the flexure preferably being encased in melted plastic film.

In a further embodiment, the flexure laminate further comprises a third layer comprising a spring steel. As in previous embodiments, typically the plastic film comprises polyimide resin, the conductive traces are formed of copper deposited onto the plastic film, the cross-section of the conductive traces is generally about 0.002 by 0.0007 inch, the cross-section of the reduced cross section portion being about 0.0004 by 0.0007 inch, and, the reduced cross section portion is melt-severed in trace conductor interrupting relation at the locus, preferably with the portion within the predetermined perimeter of the flexure being encased in melted plastic film.

In a further embodiment, the invention provides a panel comprising a laminate of plastic film and trace conductors, the panel defining multiple, individually separable flexures for disk drive suspensions, each individual flexure having a predetermined perimeter and trace conductors generally of a first cross-section and having continued extents extending to and beyond the perimeter of the flexure that define a locus of severing for detaching the flexure from surrounding laminate adjacent the flexure predetermined perimeter, the continued extents each having a portion with a reduced cross-section from the given cross-section at the locus for melting preferentially in response to a current passed through the trace conductors and the reduced cross-section portion.

In this and like embodiments, typically, the plastic film comprises polyimide resin, and the conductive traces are copper.

BRIEF DESCRIPTION OF SEVERAL VIEWS OF THE DRAWINGS

The invention will be further described in conjunction with the attacked drawings in which.

DETAILED DESCRIPTION OF THE INVENTION

One of the final operations in the manufacture of a wireless flexure is electroplating the exposed portions of the trace conductors that are not protected by the laminate plastic film, usually a polyimide film, cover layer. This is a batch process, like many preceding operations. The smallest unit being handled is a panel or sheet that typically comprises several hundred wireless flexures connected together.

The electroplating, usually of gold (10,000 A) over nickel (3000 A), provides corrosion protection for the contact points used for electrical access to the trace conductors of the flexure. Where there is plating, the contacts remain untarnished despite an oxidizing atmosphere, and effective solder contact, wire bond (ball or wedge) contact, or ultrasonic bond contact can be made with the mating parts.

Continued extents, or pigtails, of each individual flexure conductive trace extend beyond the perimeter of the flexure to define an electrical path between the panel and each individual flexure. The trace continued extent, typically made of copper like the balance of the conductive trace, located beyond the perimeter of the individual flexure defines a locus for transversely severing (detabbing) the individual flexure from the panel of flexures that is used to separate out the individual flexure from the panel. This operation is sometimes called "singulating" and comprises separation of a single part from the panel so the part can be installed on the suspension.

Figure 7:
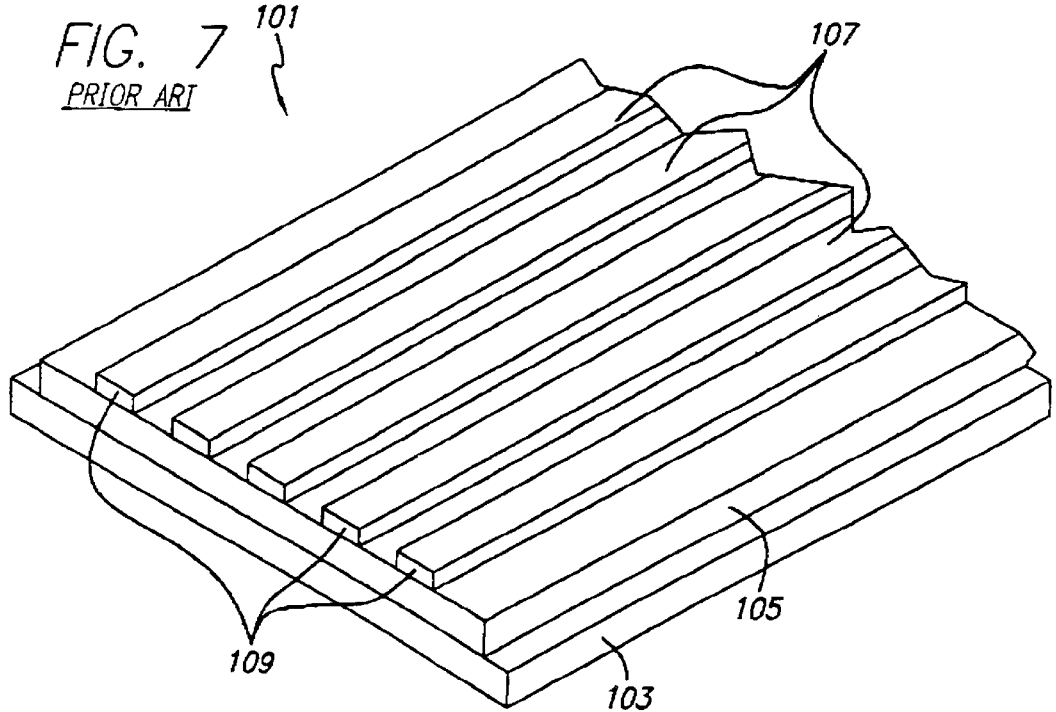
FIG. 7 is an oblique view of a PRIOR ART flexure after severing from a panel and showing the exposed trace conductor terminals.

Depending on the detailed layout of the part, the singulating operation can leave from one to six, or more, severed conductive trace continued extents at the locus of severing, beyond but adjacent the perimetrical edge of the individual flexure. The cross-section of copper material of each continued trace extent is thus exposed to the ambient atmosphere and unprotected from oxidation or other contamination, despite the electroplating of the trace conductor top and side walls above the plastic film. This is illustrated in FIG. 7 PRIOR ART where wireless flexure 101 comprising a stainless steel layer 103, an insulative film layer 105 and a series of conductive traces 107 is shown as severed from a panel (not shown). Traces 107 are plated before the severing, but after severing the trace ends 109 are newly exposed raw copper subject to corrosion.

When the detabbing leaves a cross section of unprotected copper trace, the copper will react with moisture and aerosols, including corrosive fumes, present in the air to produce oxides, hydrates, sulfates, or sulfides of copper; compounds that are particle contamination hazards for the disk drive. Some of these compounds, if they are conductive, can, in the presence of moisture, create a conductive path can possibly short out or shunt the electrical signals that are the inputs and/or output signals to the recording head the suspension supports, resulting in a defective assembly.

In accordance with the invention, the elimination of unprotected copper traces is realized by reducing the width of the trace-to-panel path to a low, even the lowest possible cross section, e.g. a 0.0004 by 0.0007 inch cross section, which is smaller than the normal 0.002 by 0.0007 inch cross section commonly found in conductive traces. This reduced cross section would extend through only portion of the trace continued extent short section between the contact pads and the panel, suitably athwart the severing or detabbing plane. The use of a cover layer of plastic film from the laminate or added is preferred in order to fuse the plastic onto the melted terminals of the selected reduced cross section portion.

Then, after plating the conductive traces, but before severing or detabbing, current is passed through the conductive trace including the reduced cross section portion. Thus, as in a fuse with a reduced cross section portion that fuses or melts, or in popular terms "blows", the conductive trace continued extent reduced cross section portion will melt effecting a severing of the conductive trace. This severing is readily effected by touching the flexure contact pads each in turn with a small (e.g. 500 mA) current source while the panel is connected to a ground. The result is to obliterate the reduced cross section portion of the trace; this portion is not needed in any event after the plating operation. As an added benefit, when thusly detabbed across the plane, the melted edges are contained within the laminated plastic. There is produced a wireless flexure having a trace end that is protected from the environment and contained in plastic so the environment is also protected from the trace end.

Figure 1:
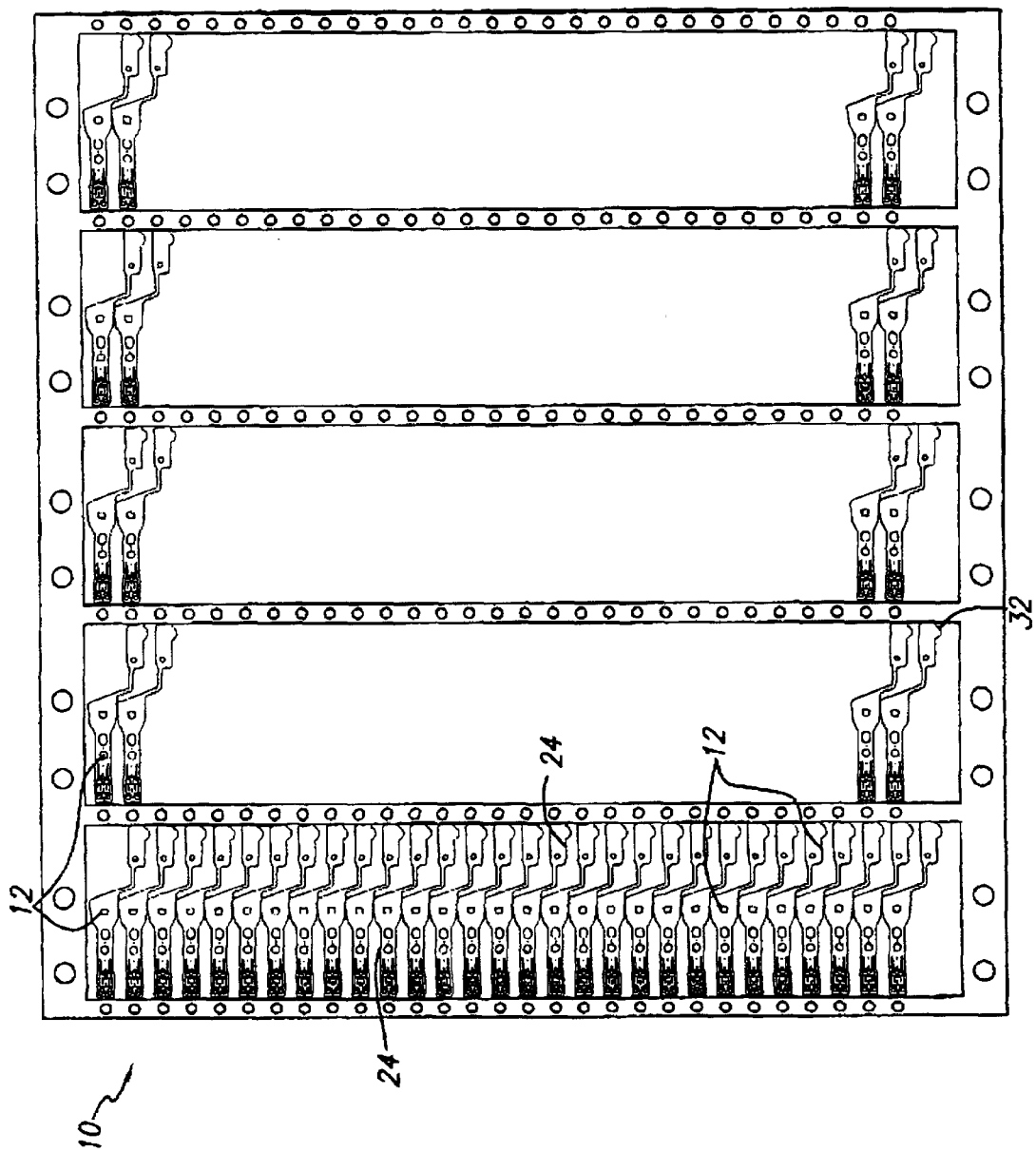
FIG. 1 is a plan view of a panel of unseparated flexures according to the invention.
Figure 2A:
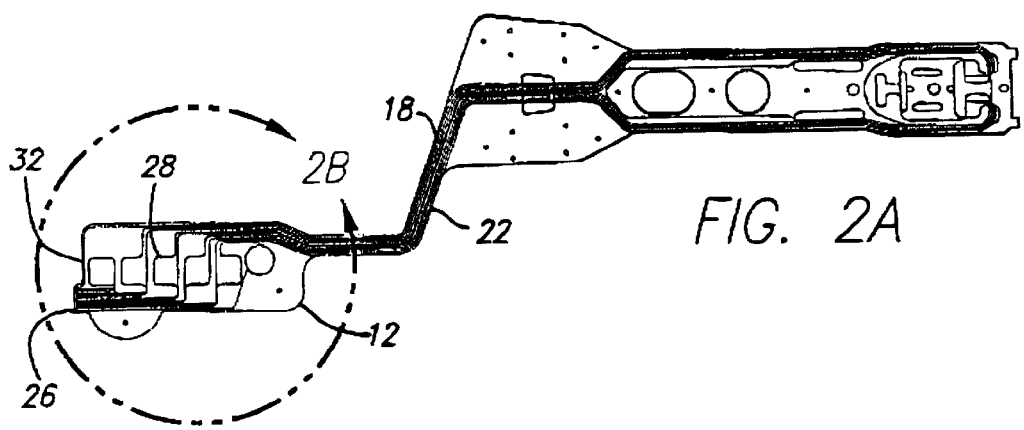
FIG. 2A is a plan view a singulated flexure from the panel of FIG. 1.
Figure 2B:
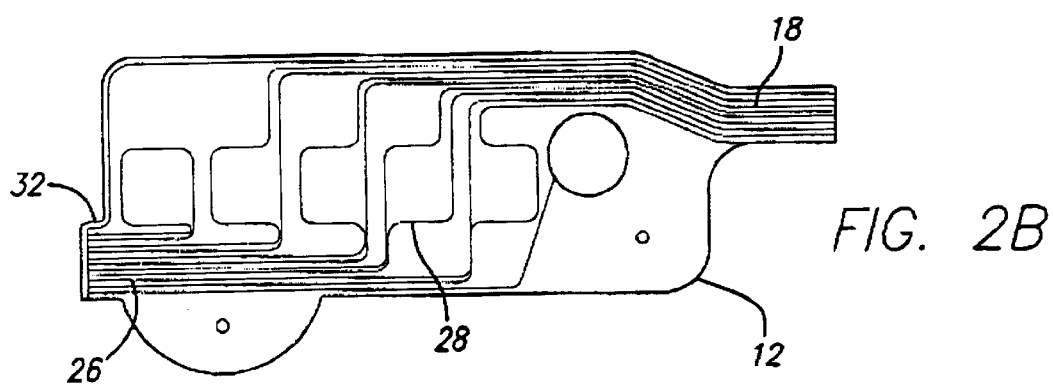
FIG. 2B is a view of the proximate end of the singulated flexure of FIG. 2A taken on line 2B in FIG. 2A.

With reference now to the drawings, the invention is shown in FIGS. 1–6. FIG. 1 shows a panel 10 comprising multiple individually separable wireless flexures 12. As shown best in FIG. 3, the panel and each flexure 12 therein comprises a laminate of a steel layer 14, an insulative plastic film layer 16, comprised suitably of a polyimide resin, and plural conductive traces 18, comprised suitably of copper, gold, silver or aluminum, and a plastic film cover layer 22. The individual flexures have a defining perimeter 24 spaced from adjacent flexure perimeters. As shown in FIGS. 2A, 2B and 4A, extending across and beyond these perimeters 24 are continued extents 26 (pigtails) of the individual conductive traces 18, typically from contact pads 28 corresponding to each conductor. The continued extents 26 remain joined to a common conductor 32 following manufacturing operations that provide the panel shown in FIG. 1. Separating the flexures 12 from the panel 10 (singulating the flexures) involves detabbing or severing the continued extents 26 along a severing plane P normal to the longitudinal axis of the extents 26; this can result in exposing the conductive traces 18 (now plated) at the locus of severing which is coincident with the severing plane P.

Figure 4A:
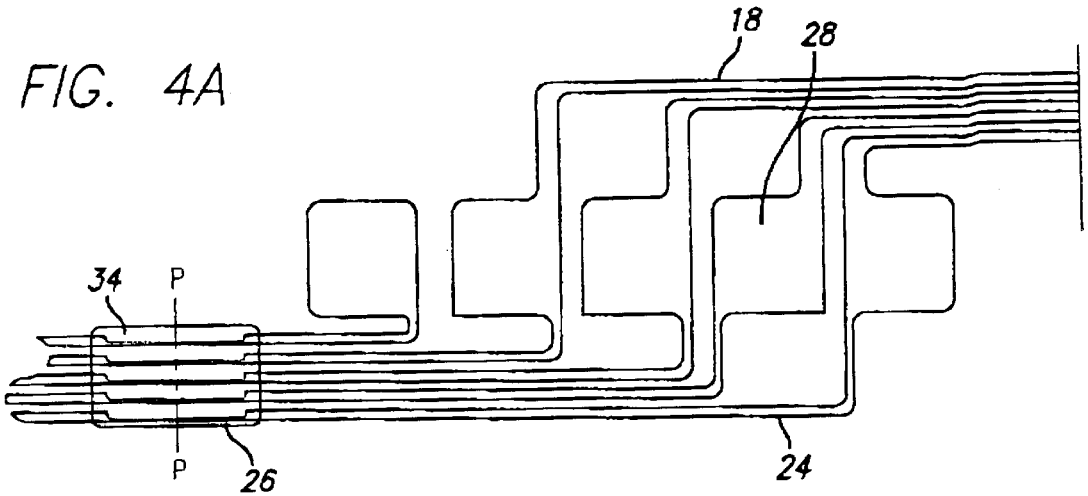
FIG. 4A is a detail view of the proximate end of the singulated flexure of FIG. 2A.
Figure 3:
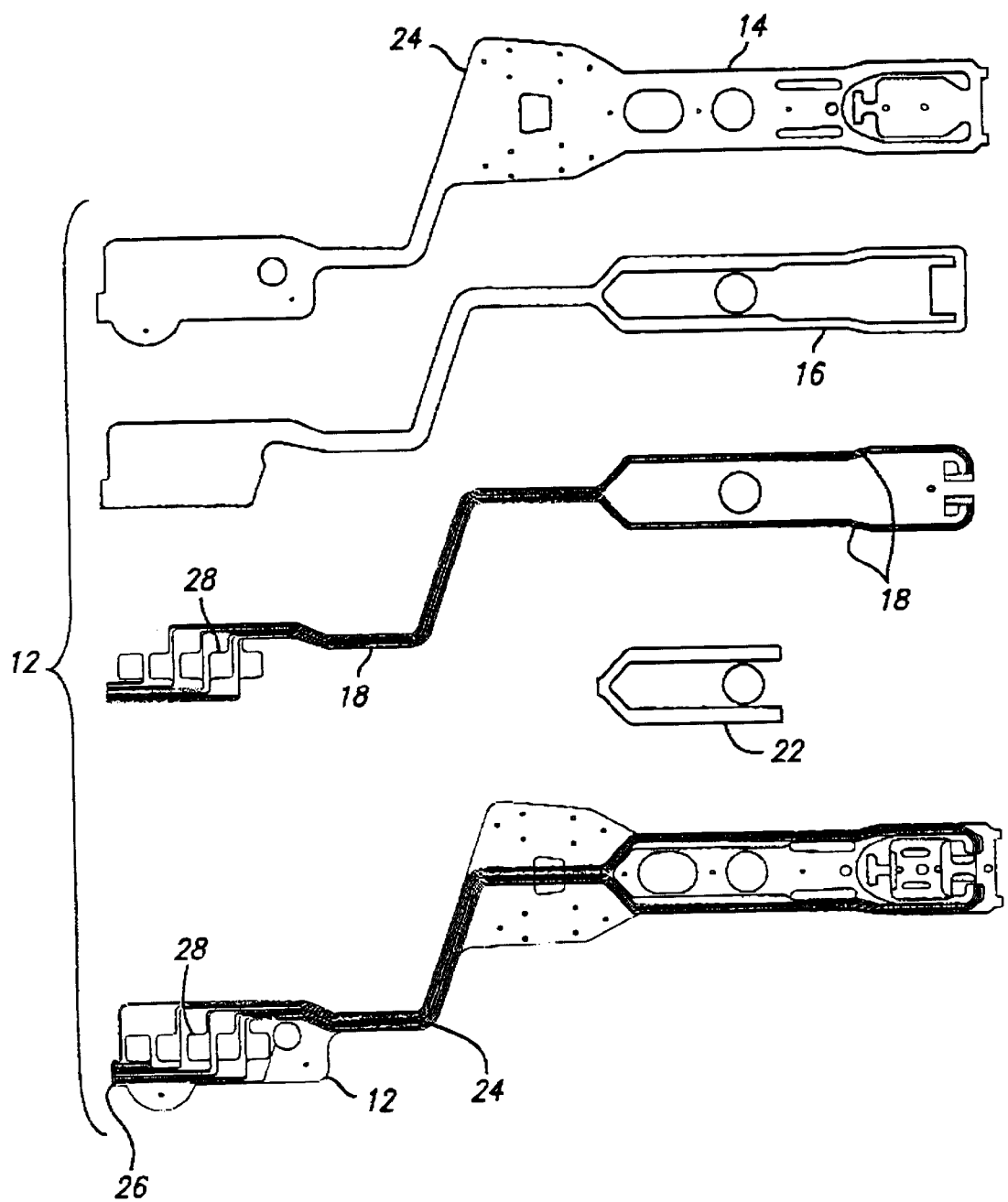
FIG. 3 is an exploded view of the singulated flexure of FIG. 2A.
Figure 4B:
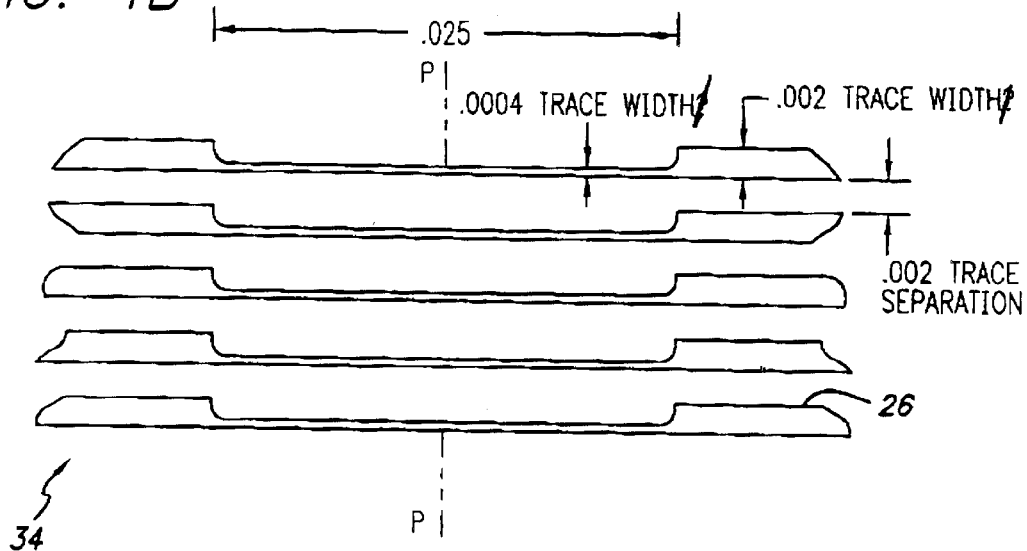
FIG. 4B is a fragmentary detail view of the reduced cross section portion of the trace conductors of the singulated flexure before severing.
Figure 5:
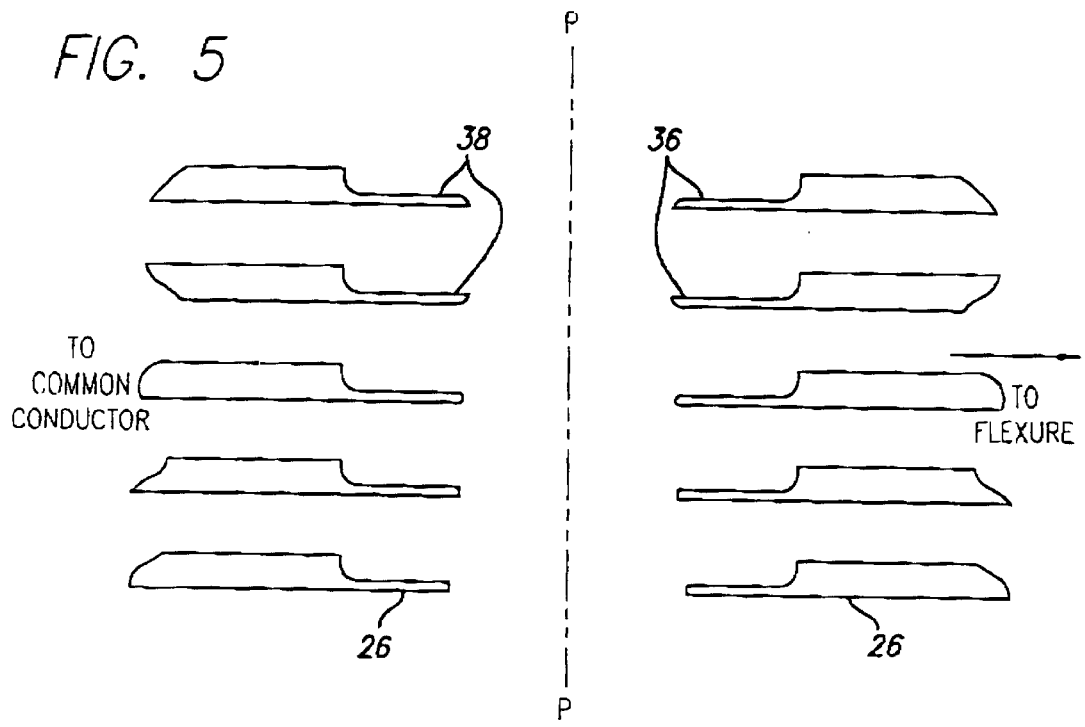
FIG. 5 is a schematic detail view of the singulated flexure portion trace conductor continued extents after severing.
Figure 6:
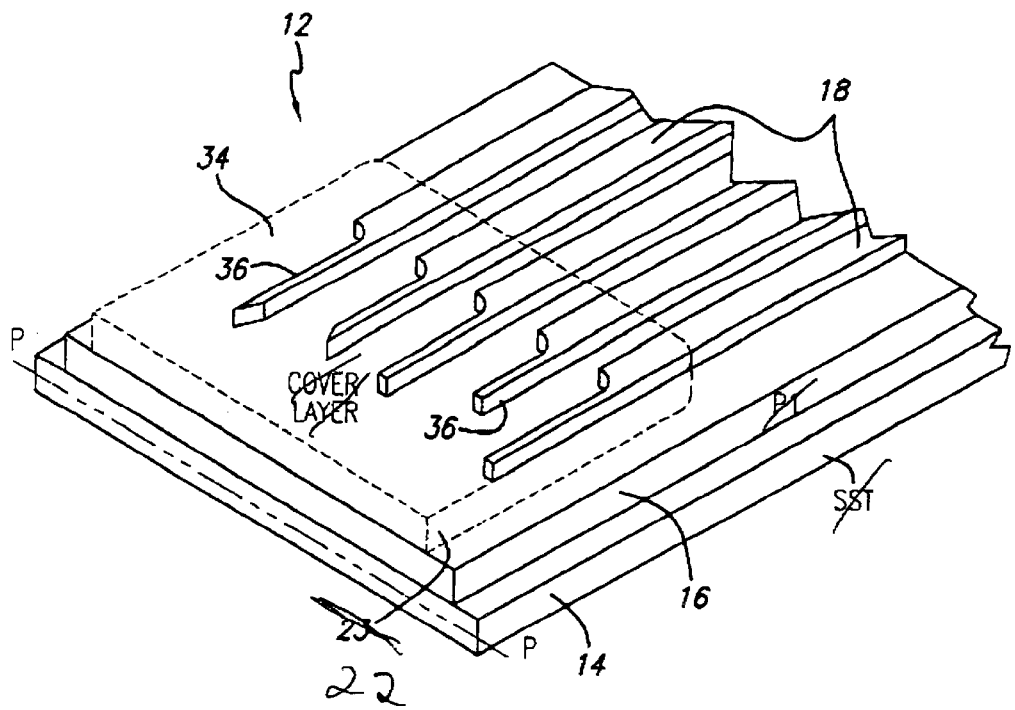
FIG. 6 is an oblique view of the singulated flexure after severing from a panel and showing the plastic encased terminals of the continued extents.

The invention flexure 12 trace conductors 18 are generally of copper and of a first cross-section, e.g. 0.002 by 0.0007, within the flexure perimeter 24. With reference to FIGS. 4A and 4B flexure trace continued extents 26 extending to and beyond the flexure perimeter 24 and across the locus of severing marked by the severing plane P. Continued extents 26 have a portion 34 with a reduced cross-section, suitably at least a 50% reduction in cross section, and in the case of a typical trace of 0.002 by 0.0007 a reduction to e.g. 0.0004 by 0.0007 from the first cross-section shown as typically straddling the locus. Portion 34 because of its reduced cross section will melt preferentially (differentially) when subjected to a current, see FIGS. 5 and 6 where the trace terminals 36, 38 are shown after melting from current passage. In FIG. 5 the plastic film layer 16 has been fused by the heat of the melting portions 34 and covered over or encased the terminals 36 that are retained by the flexure 12 while the other terminals 38 are thrown away with non flexure parts of the panel 10.

The invention manufacturing process thus includes defining a plurality of flexures 12 in the laminate panel 10, each having a predetermined perimeter 24 that is spaced from the predetermined perimeters of adjacent flexures, maintaining a continued extent 26 of the conductive traces 18 across their respective flexure predetermined perimeters to electrically connect the conductive traces to a common conductor 32, and separating the conductive traces of individual flexures from the laminate panel by selectively melting the trace continued extents to sever the individual flexure conductive traces from the remainder of the flexures defined in the laminate and melt adjacent plastic film thereonto in exposed conductive trace-free relation.

Suitably the current is applied at the contact pads 28 while maintaining the panel grounded, using a sufficient current from the pads to ground through the continued extent portions 34 to differentially melt the portions selectively from the remainder of the trace conductors.

The invention thus provides a better solution to the problem of environmental corrosion of exposed copper conductive traces in wireless flexures and lessens or eliminate results of such corrosion including contaminating aerosols and shunting of conductors with an improved wireless flexure manufacturing process in which the continued extents of the trace conductors at the locus of severing are electrical heat-severed to free each flexure from the panel of flexures and to encased the trace terminals in insulating plastic film. The invention provides in the course of a laminate flexure manufacturing operation a part that has its copper continually encased with plastic film, and in a preferred embodiment, totally free of exposed copper, such that particles or conductive paste associated with the copper conductors are isolated from the environment and blocked from creating harm.

The invention further provides a manufacturing process for a wireless flexure and a flexure product in which the conductive traces are modified at their pigtail continued extents to be of lesser cross-section, such that a current passing through the traces preferentially melts the reduced cross-section and severs the trace pigtail there. Heat conducted to the surrounding plastic film at the locus of severing also serves to melt the plastic film layer at the locus so as to encase the trace terminals and reduce or eliminate unplated copper exposure.

The foregoing objects are thus met.

I claim:

1. A flexure for a disk drive suspension comprising a laminate of plastic film and trace conductors, said flexure having a predetermined perimeter, said trace conductors being generally of a first cross-section, said trace conductors having continued extents extending to and beyond the perimeter of said flexure, said continued extents defining a locus of severing for detaching said flexure from surrounding laminate adjacent said flexure predetermined perimeter, said continued extents having at said locus a portion with a reduced cross-section from said first cross-section for melting preferentially in response to a current passed through said trace conductors and said reduced cross-section portion.

2. The flexure according to claim 1, in which said plastic film comprises polyimide resin.

3. The flexure according to claim 1, in which said conductive traces are formed of copper deposited onto said plastic film.

4. The flexure according to claim 1, in which the cross-section of said conductive traces is generally about 0.002 by 0.0007 inch, the cross-section of said reduced cross-section portion being about 0.0004 by 0.0007 inch.

5. The flexure according to claim 1, in which said reduced cross section portion is melt-severed in trace conductor interrupting relation at said locus.

6. The flexure according to claim 1, in which said reduced cross section portion is melt-severed in trace conductor interrupting relation, whereby said trace conductors adjacent said portion within said predetermined perimeter of said flexure are encased in melted plastic film.

7. The flexure according to claim 1, in which said laminate further comprises a third layer, said third layer comprising steel bonded to said plastic film.

8. The flexure according to claim 7, in which said plastic film comprises polyimide resin.

9. The flexure according to claim 8, in which said conductive traces are formed of copper deposited onto said plastic film.

10. The flexure according to claim 9, in which the cross-section of said conductive traces is generally about 0.002 by 0.0007 inch, the cross-section of said reduced cross-section portion being about 0.0004 by 0.0007 inch.

11. The flexure according to claim 10, in which said reduced cross section portion is melt-severed in trace conductor interrupting relation at said locus.

12. The flexure according to claim 11, in which said reduced cross section portion is melt-severed in trace conductor interrupting relation, whereby said trace conductors adjacent said portion within said predetermined perimeter of said flexure are encased in melted plastic film.

* * * * *